United States Patent [19]

Schuermeyer et al.

[11] 4,091,460

[45] May 23, 1978

[54] QUASI STATIC, VIRTUALLY NONVOLATILE RANDOM ACCESS MEMORY CELL

[75] Inventors: Fritz L. Schuermeyer, Yellow Springs; Charles R. Young, Xenia, both of Ohio

[73] Assignee: The United States of America as represented by the Secretary of the Air Force, Washington, D.C.

[21] Appl. No.: 729,754

[22] Filed: Oct. 5, 1976

[51] Int. Cl.² .................. G11C 11/24; G11C 11/40
[52] U.S. Cl. .................................. 365/154; 307/279; 307/238; 365/149; 365/184
[58] Field of Search .............. 340/173 FF, 173 CA; 307/238, 279, 291; 357/23, 54

[56] References Cited

U.S. PATENT DOCUMENTS

| | | | |
|---|---|---|---|
| 3,662,351 | 5/1972 | Ho et al. | 340/173 FF |
| 3,662,356 | 5/1972 | Michon et al. | 340/173 FF |
| 3,916,390 | 10/1975 | Chang et al. | 340/173 R |

Primary Examiner—Stuart N. Hecker
Attorney, Agent, or Firm—Joseph E. Rusz; Robert Kern Duncan

[57] ABSTRACT

A nonvolatile Charge Injection Device (NOVCID) of Metal-Nitride-Oxide-Semiconductor (MNOS) material is operated in a novel manner in combination with a flip-flop to provide a charge pumped volatile memory storage system that can be continuously nondestructively read and on command, by applying a high positive potential to the field plate of the NOVCID, the information stored in the volatile mode is transferred to the nonvolatile state. To recover the stored information an alternating current signal is applied to the field plate.

1 Claim, 4 Drawing Figures

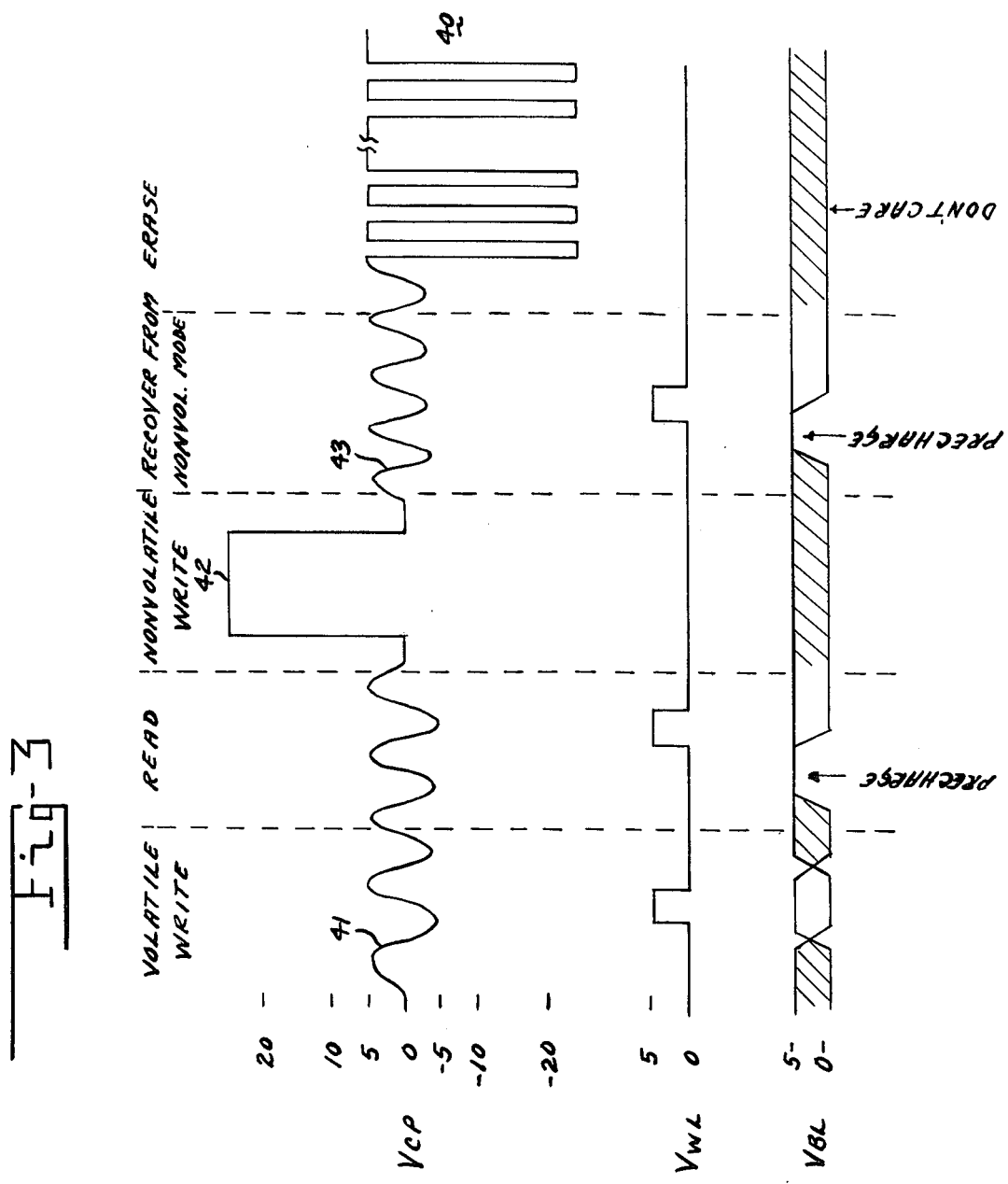

QUASI STATIC, VIRTUALLY NONVOLATILE RANDOM ACCESS MEMORY CELL

RIGHTS OF THE GOVERNMENT

The invention described herein may be manufactured and used by or for the Government of the United States for all governmental purposes without the payment of any royalty.

BACKGROUND OF THE INVENTION

The field of the invention is in solid state memory devices, and more particularly in nonvolatile charge injection devices.

The operation of Metal-Nitride-Oxide-Semiconductor (MNOS), Nonvolatile Charge Injection Devices (NOVCIDs), as nonvolatile information storage devices is well known. U.S. Pat. Nos. 3,911,464 to patentees Chang and Lee; 3,662,356 to patentees Michon and Burke; 3,889,287 to patentee Powell; and 3,950,737 to patentees Nojima and Matsuno are illustrative of the prior art and valuable background information in comprehending the present invention. The concept of virtually nonvolatile data storage also was presented by J. C. Lockwood et al. at the 1972 WESCON, Sept. 19–22, 1972, Los Angeles, CA.

SUMMARY OF THE INVENTION

The invention is a novel memory cell circuit and method of storing information in metal-nitride-oxide-semiconductor nonvolatile charge injection devices to provide a high speed, moderate density (approximately 4000 bits per chip) nonvolatile write-read memory.

BRIEF DESCRIPTION OF THE DRAWING

FIG. 3 is a set of typical waveform voltages illustrating the operation of a memory cell.

DESCRIPTION OF THE PREFERRED EMBODIMENT

The quasi static nonvolatile Random Access Memory (RAM) cell disclosed herein utilizes a conventional Nonvolatile Charge Injection Device (NOVCID) such as disclosed by previously referenced U.S. Pat. No. 3,911,464. The circuit operates to provide a conventional volatile memory, then when it is desired to transfer the volatile information to the nonvolatile storage mode, the charge-pump voltage is elevated. The preferred device is fabricated using n-channel technology and employing Metal-Nitride-Oxide-Semiconductor (MNOS) NOVCIDs with well pumping, and n-channel Metal-Oxide-Semiconductor (MOS) Field Effect Transistors (FET) all fabricated as a memory cell unit on a common substrate with a plurality of similar cell units.

Figure 1:
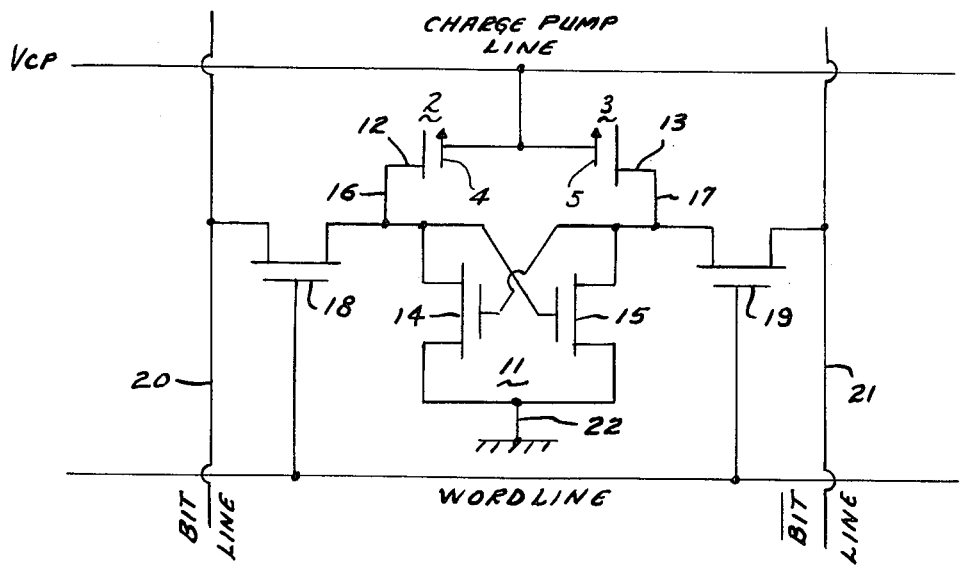
FIG. 1 is a schematic representation of an embodiment of a typical memory cell.
Figure 2:
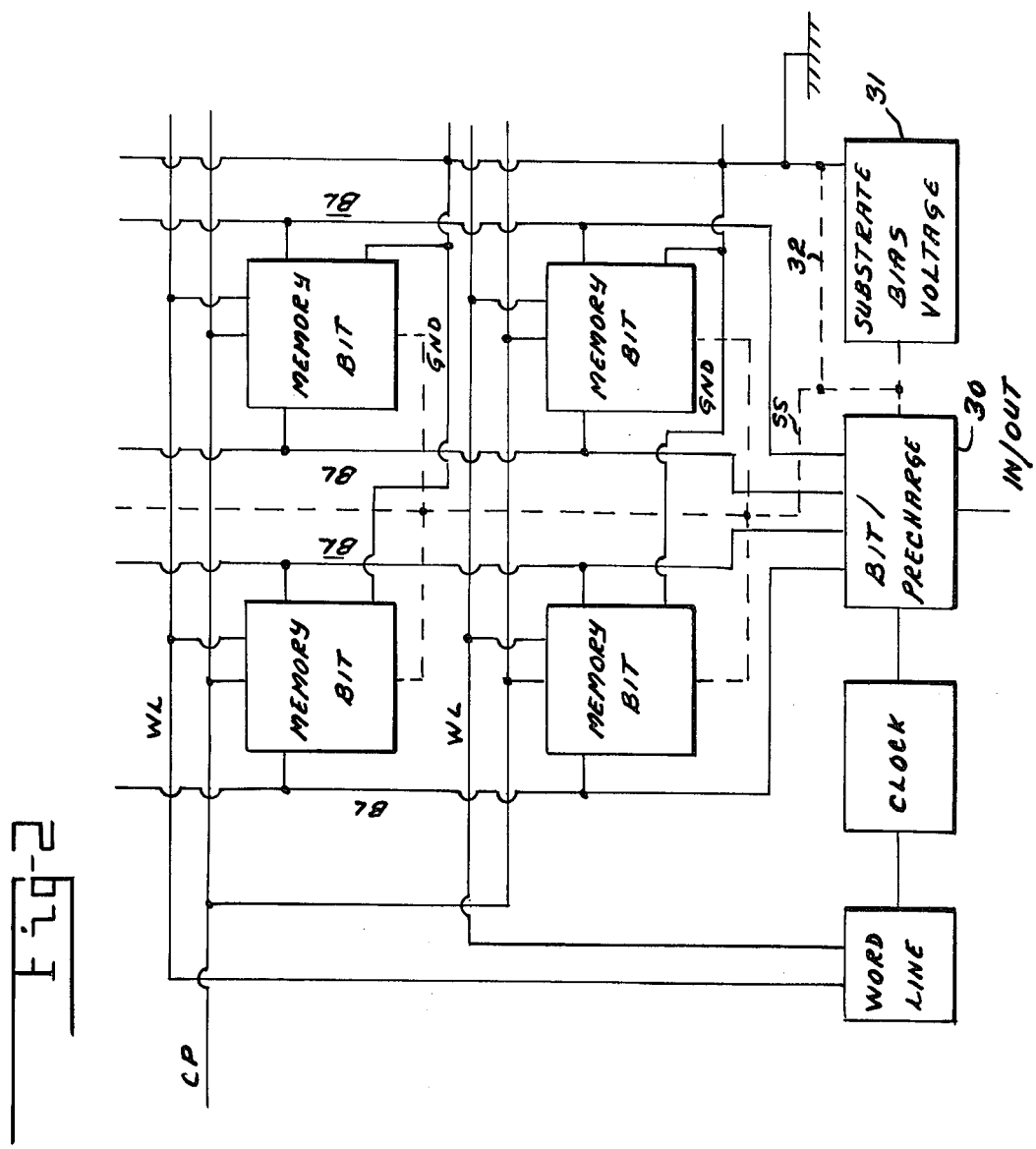
FIG. 2 is a block diagram of a typical memory control circuit.

Referring to FIG. 1, a typical cell embodiment comprises a cross coupled flip-flop 11 with the load elements on the flip-flop being NOVCIDs 2 and 3 through their diffusion connection 12 and 13. In operation one of the active transistors, 14 or 15, is conducting while the other one is nonconducting. For illustration, assume transistor 14 is conducting; then node 16 in one load line of the flip-flop is at a zero volt potential while node 17 in the other load line assumes a positive voltage. The zero volt potential at 16 keeps transistor 15 nonconducting. This allows a positive voltage to remain at 17 which keeps transistor 14 conducting. In the write mode, access transistors 18 and 19 become conducting and Bit Line 20 and $\overline{\text{Bit}}$ Line 21 are connected (externally to the memory bit cell of FIG. 1) by Bit/Precharge circuit 30 shown in FIG. 2, either respectively to the substrate voltage $V_{SS}$, which in most embodiments will be at zero volts to the positive supply voltage $V_{DD}$ (conventionally +10 volts), or the inverse. Generally in most embodiments flip-flop ground 22 will be connected to, or common with the substrate, and the substrate will be at zero potential, However, in some embodiments (due to the particular characteristics of the materials and components used in fabrication) it may be desirable to have a small negative bias on the substrate. In these instances substrate bias voltage source 31, as shown in FIG. 2, is used. Otherwise it is omitted and the substrate is at ground potential. This is schematically represented by dotted line connection 32. In this description of a particular embodiment a "0" is represented by $V_{SS}$ on the Bit line and $V_{DD}$ on the $\overline{\text{Bit}}$ line. A "1" is represented by the inverted voltage pattern. The current flowing will cause the flip-flop to assume the state dictated by the Bit lines (e.g., if the Bit line is at $V_{DD}$ potential, and the $\overline{\text{Bit}}$ line is at $V_{SS}$ potential, node 16 will go to $V_{DD}$ and node 17 will go to $V_{SS}$ potential). After transistors 18 and 19 are turned off, the flip-flop remains in its state since NOVCIDs 2 and 3 supply currents due to charge pumping. For the best charge pumping action the NOVCIDs should be in the erased or H state (i.e., they should have the largest possible potential well). A NOVCID is erased by applying a high negative potential, typically, approximately −25 volts for 10 msec, to its field plate via the charge pump line, or a series of shorter negative pulses as illustrated at 40 in $V_{CP}$ waveform diagram shown in FIG. 3. During operation it is recommended that care be taken to keep the NOVCIDs in the H state. Thus, even though an approximately symmetrical ac pumping signal 41 is shown in FIG. 3, it may, with some circuits, be desirable to utilize a nonsymmetrical charge pump signal which stays either longer in the negative voltage region or uses a larger negative voltage than a positive voltage. In the read mode access transistors 18 and 19 are made conducting and the Bit line and $\overline{\text{Bit}}$ line are connected to a sense circuit, providing for the read of the state of the flip-flop. Note that the read operation is nondestructive. However, to allow multiple readings from the same cell within one charge pump cycle, it is advisable to use pull up resistors outside the cell to refresh the information. The transfer of information from volatile to nonvolatile storage mode may best be understood by considering the following in connection with the waveforms of FIG. 3. To transfer the data from the volatile to the nonvolatile mode the NOVCID field plates 4 and 5 are raised to a high positive potential as illustrated at 42 in FIG. 3. This is typically a +25 volt 10 msec pulse. Assume that transistor 14, FIG. 1, is conducting and transistor 15 is nonconducting. The application of a high positive voltage to the field plate of a NOVCID causes a depletion region to be formed in a NOVCID. Since transistor 14 is conducting, the depletion area in NOVCID 2 will be filled up with electrons and consequently, the potential applied to the field plate will appear across the insulator for strong writing action onto the "L" state, resulting in a strongly reduced or eliminated potential well. Since transistor 15 is nonconducting, the depletion region in NOVCID 3 cannot be filled up with charge and consequently the potential applied to the field plate of NOVCID 3 is shared between the insulator and the depletion region. Consequently, hardly any writing action exists in NOVCID 3 and it remains in the "H" state. Now the cell can stay without power applied for extended periods of time (depending on the MNOS structure, up to hundreds of years) without losing the stored information.

To recover data from the nonvolatile storage mode an ac signal is applied to the field plate of the NOVCIDs. While ac signal 43 in FIG. 3 is shown uniform it may be desirable with some embodiments that it have a rising peak voltage in order to ascertain that at least several pumping actions are utilized to reset the flip-flops. Since NOVCID 3 is, from the foregoing illustration, in the "H" state, its charge pump current will exceed that of NOVCID 2. Consequently, node 17 will rise to its positive voltage level, causing transistor 14 to be conducting and node 16 to stay at zero voltage potential. Obviously, the previously existing voltage pattern is reestablished. For read mostly applications, the cell can be read out as many times as required and the power can be disrupted and reestablished as often as desired. For random access memory applications, the NOVCIDs should be erased after establishing the node voltages. Erasing is accomplished by applying high negative potentials 40 to the NOVCID field plates. In order not to lose the volatile information during a long erase period (e.g., 10 msec), charge pumping is preferably performed during the erase operation. This is accomplished by using a series of short (100 μsec) −25 volt erase pulses and by charge pumping between these erase pulses. After the erase mode, the cell is in its volatile storage mode and ready for nonvolatile storage.

Figure 4:
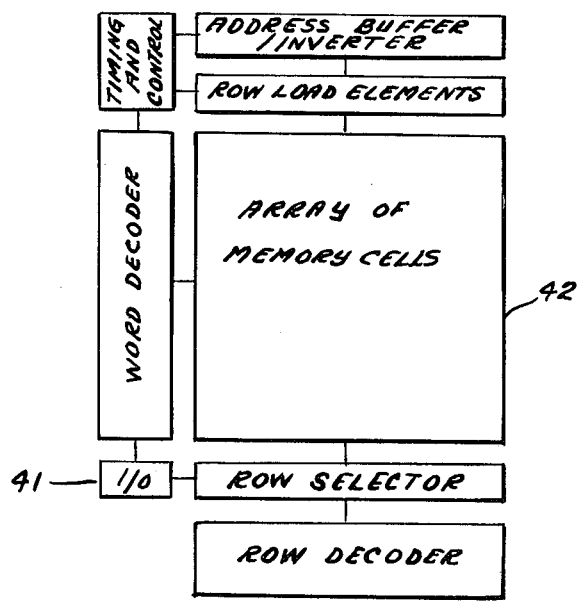
FIG. 4 is a representative arrangement of a typical memory chip.

The memory chip layout illustrated in FIG. 4 is typical and not critical to the invention. The I/O (input/output) 41 and other elements controlling the array of memory cells 42 are conventionally functioning elements. The invention is in the combination comprising the cell bit structure of the array of cells, as illustrated in the embodiment of FIG. 1, and the method of operating the structure to provide the volatile storage, the nonvolatile storage, the transition from the former to the latter, and the recovery of the stored information.

We claim:

1. A nonvolatile information storage cell for a storage system having a charge pump line, a bit line, a $\overline{\text{bit}}$ line, and a word line, said cell comprising:
  a. a flip-flop including a first and a second metal oxide semiconductor field effect transistors having a respective first load line and a respective second load line;
  b. a first metal-nitride-oxide-semiconductor nonvolatile charge injection device having a field plate and a diffusion connection, the said diffusion connection connected to the said first load line;
  c. a second metal-nitride-oxide-semiconductor nonvolatile charge injection device having a field plate and a diffusion connection, the said diffusion connection connected to the said second load line;
  d. means for connecting the said field plate of the said first nonvolatile charge injection device and the said field plate of the said second nonvolatile charge injection device to the said charge pump line;
  e. a first access metal oxide semiconductor field effect transistor cooperating with the said word line, the said bit line, and the said first load line;
  f. a second access metal oxide semiconductor field effect transistor, cooperating with the said word line, the said $\overline{\text{bit}}$ line, and the said second load line; and
  g. means including the said first and second access transistors to provide an input/output to the said storage cell.

* * * * *